United States Patent [19]

Knee

[11] Patent Number: 5,589,831
[45] Date of Patent: Dec. 31, 1996

[54] FULLY DIFFERENTIAL FLASH ADC BASED ON THE VOLTAGE FOLLOWER AMPLIFIER STRUCTURE

[75] Inventor: Derek L. Knee, Sunnyvale, Calif.

[73] Assignee: Samsung Semiconductor, Inc., San Jose, Calif.

[21] Appl. No.: 380,778

[22] Filed: Jan. 30, 1995

[51] Int. Cl.$^6$ .................................................... H03M 1/36
[52] U.S. Cl. ............................................ 341/159; 341/155
[58] Field of Search ...................................... 341/159, 156, 341/155, 158, 160

[56] References Cited

U.S. PATENT DOCUMENTS 5,231,399  7/1993  Gorman.
5,313,206  5/1994  Davies et al. ............................ 341/156

FOREIGN PATENT DOCUMENTS 0311105  10/1988  European Pat. Off. ......... H03M 1/14
91/12667  8/1991  WIPO .............................. H03M 1/36

OTHER PUBLICATIONS

"A 10–b 75 MSPS Subranging A/D Converter with Integrated Sample and Hold," Reinhard Petschacher, et al., *IEEE Journal of Solid State Circuits*, vol. 25, No. 6, Dec. 1990, pp. 1339–1346.

"A 5 V, 6–b, 80 Ms/s BiCMOS Flash ADC," Hooman Reyhani, et al., *IEEE Journal of Solid State Circuits*, vol. 29, No. 8, Aug. 1994, pp. 873–878.

*Primary Examiner*—Brian K. Young
*Attorney, Agent, or Firm*—Townsend and Townsend and Crew LLP

[57] ABSTRACT

A differential flash ADC includes an input follower differential input stage for receiving a differential input signal. The outputs of the differential input stage are coupled to legs of a differential resistive ladder having nodes cross-coupled to the inputs of a comparator array. Each leg of the differential resistor ladder is terminated by a current source.

4 Claims, 2 Drawing Sheets

1

FULLY DIFFERENTIAL FLASH ADC BASED ON THE VOLTAGE FOLLOWER AMPLIFIER STRUCTURE

BACKGROUND OF THE INVENTION

1. Field of the Invention

The present invention relates generally to analog to digital convertors (ADCs) and more particularly to fully differential flash ADCs utilizing comparator arrays.

2. Description of the Relevant Art

Standard flash ADCs compare an analog input voltage with reference voltages derived from a resistor string. The architecture is inherently unsymmetrical with respect to the inputs of the required comparator array and, together with the high and nonlinear input capacitance, causes the performance degradation of conventional flash ADCs at high analog frequencies.

A fully differential flash ADC is described in a paper by Petschacher et al. entitled *A 10-b 75-MSPS Subranging A/D Converter with Integrated Sample and Hold*, IEEE JOURNAL OF SOLID-STATE CIRCUITS, VOL. 25, NO. 6, DECEMBER 1990, pp. 1339–1346.

FIG. 3 depicts the circuit described in the paper. The circuit includes a "differential reference ladder" (DRL) comprising a common emitter differential amplifier 30 with two identical resistor strings 32R and 32L, each including a load resistor and bit resistors, substituting for single collector-coupled load resistors. The differential amplifier comprises first and second npn transistors Q3' and Q4' having their bases coupled to receive a differential input signal and their emitters respectively coupled to emitter resistors 38 and 40, each having resistance RE and for providing emitter degeneration and establishing the overall ADC gain. As is well-known, the common-emitter coupled transistors in Q3' and Q4' and 36 have an amplifier gain of –RC/RE where RC is the sum of the resistances in each load resistor string.

Transistors Q1' and Q2' have their bases coupled to a reference voltage and their emitters respectively coupled to the resistor strings 32L and 32R to facilitate VBE compensation of the transistors Q3' and Q4' in the differential amplifier 30.

While the above-described circuit has many desirable characteristics, it also has significant problems. In particular, the requirement of the emitter resistor to provide emitter degeneration increases the size and complexity of the circuit in an integrated circuit because resistors take up space. In practice, if the DRL consists of 2N resistors then the emitter resistors, RE, require another 2N resistors for a total of 4N resistors.

Additionally, the common emitter differential input stage limits the dynamic range and bandwidth of the input signal, the linearity of the output signal, and the minimum power supply voltage level. The requirement of extra transistors to facilitate VBE compensation further complicates the circuit.

SUMMARY OF THE INVENTION

The present invention is a fully differential flash ADC that utilizes a voltage follower input stage to eliminate the requirement of an emitter or source degeneration resistor and VBE compensation transistors and also provides other performance advantages.

According to one aspect of the invention, a voltage follower differential input stage receives a differential input to be converted to a digital value and provides a differential output signal at first and second outputs.

A differential resistor ladder (DRL) connects the first and second outputs of the differential input stage to first and second current sources. The DRL has first and second legs, with each leg comprising the same number (N+1) of series connected resistive elements with the terminals of the resistive elements forming a plurality of nodes. An input node of each leg is the resistive element terminal coupled to one output of the differential input stage and the output node is the resistive element terminal coupled to a current source. The current sources cause a constant current, I0, to flow through each leg generate a constant voltage level difference between adjacent nodes dependent on the constant current value.

The nodes of each leg of the DRL are cross-coupled to the inputs of a comparator array. The array comprises (N+2) comparators, with the nth comparator, n=0, 1, ..., N, N+1, having a first input coupled to a node of the first leg displaced from the output node by n nodes and a second input coupled to a node in the second leg displaced from input node of the second leg by n nodes.

In a bipolar implementation, the use of a voltage follower input differential stage eliminates the need for a degenerative emitter resistor and a VBE compensation circuit. The circuit configuration also increases input signal dynamic range and bandwidth, output signal linearity, and reduces the required power supply voltage level.

Other features and advantages of the invention will become apparent in view of the following detailed description and appended drawings.

DESCRIPTION OF THE PREFERRED EMBODIMENT

Figure 1:
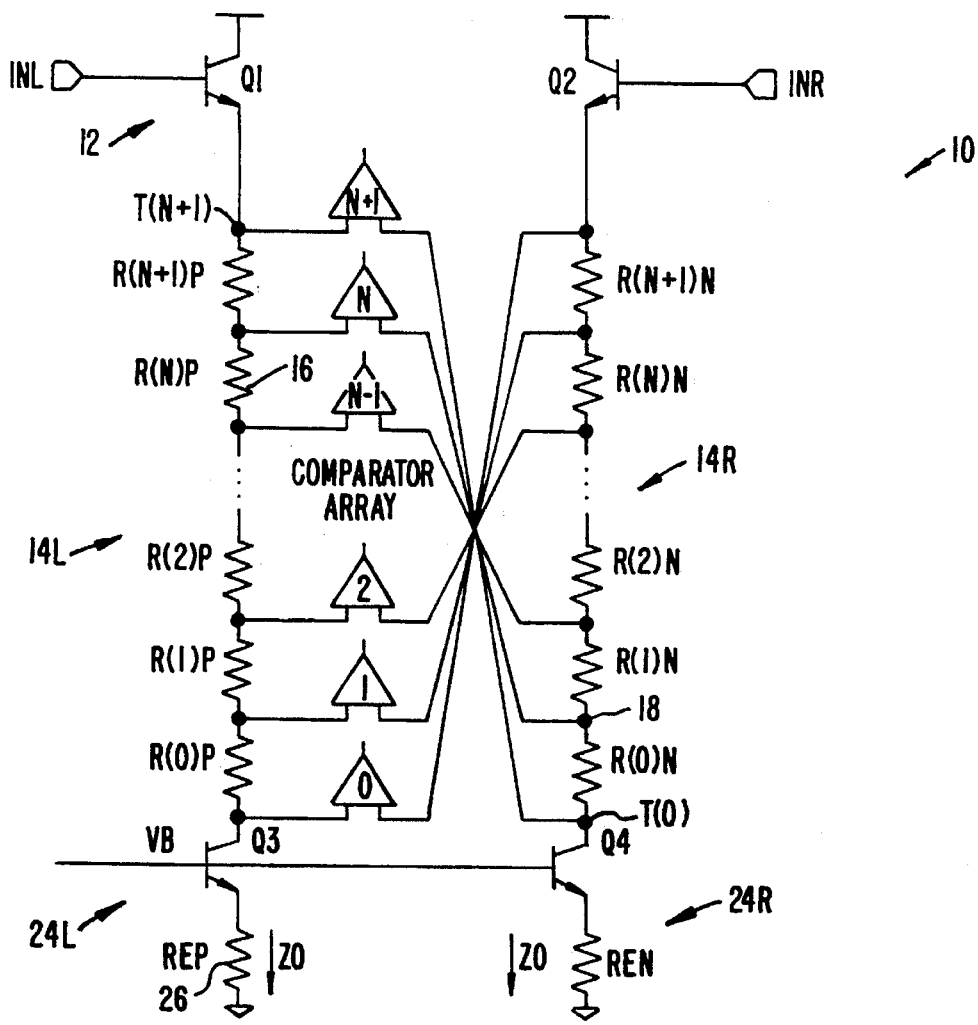
FIG. 1 is a circuit diagram of a preferred embodiment of the invention.

FIG. 1 is a circuit diagram of a preferred embodiment of the invention. The circuit is a fully differential analog to digital convertor (ADC) 10 based on a common collector amplifier structure. The common collector (emitter follower) differential input stage 12 includes bipolar npn transistors Q1 and Q2 each having a collector coupled to a supply voltage (VCC), a base coupled to receive one part (INL and INR respectively) of a differential input signal and an emitter coupled to one leg of a differential resistor string (DRL) 14.

The DRL 14 has a left leg 14L and a right leg 14R, each including (N+1), where N is an even integer, series connected RBIT resistors 16 (R(n)L and R(n)R respectively) for n=0, 1, 2, ..., N. The terminals of the RBIT resistors 16 form a series of (N+2) nodes 18 (T(n)R and T(n)L) for n=0, 1, 2, ..., N+2. Each leg has an input node T(N+1) coupled to an emitter of Q1 or Q2 and an output node T(0). An array of comparators 20 have inputs which are cross-coupled between the nodes 18 of the legs of the DRL 14. For example, the 0th comparator, C0, has a first input coupled to the output node T(0)L and a second input coupled to the input node T(N+1)R. In general the comparator Cn has its left input coupled to a node, T(n), displaced by n nodes from the output node, T(0), and its right input coupled to a node, T(N+1−n) displaced n nodes from the input node, T(N+1).

Each leg of the DRL has an output node, T(0) coupled to a current source 24L or 24R. The left current source includes a bipolar npn transistor Q3 having its collector coupled to the output terminal T(0)L of the left leg of the DRL 14, its base coupled to receive a stable bias voltage (VB), and an emitter coupled to a resistor 26 (REL). As is well-known in the art, the current source 24 sinks a constant current having a value I0 equal (VB−VBE)/REL. The right current source is similarly configured and sources the same current I0. The reference current, I0, is derived from a temperature compensated Bandgap voltage reference (not shown). This voltage reference is imposed upon a similar resistor type to the RBIT resister used in the DRL 14. In this way the reference current adapts to variations in RBIT.

The operation of the circuit depicted in FIG. 1 will now be described. Each of the RBIT resistors 16 have the same value of resistance (R) so that the voltage drop across each resistor (equal to the differential voltage DV between adjacent nodes 18 of a DRL leg) is equal to I0*R. Accordingly, with equal input signals at INL and INR, the zero-signal state, if the voltage value at node T(0) is given a value of 0 volts then the voltage at T(1)=DV, at T(2)=2 DV, and at T(n)=nDV.

The voltage input to the comparator is the difference between the right input and left input of the comparator. For the zero-signal state, the input to 0th comparator, C0, is (N+1)DV, the input to the first comparator, C1, is (N−1)DV, and the input to the second comparator, C2, is (N−3)DV.

Figure 2:
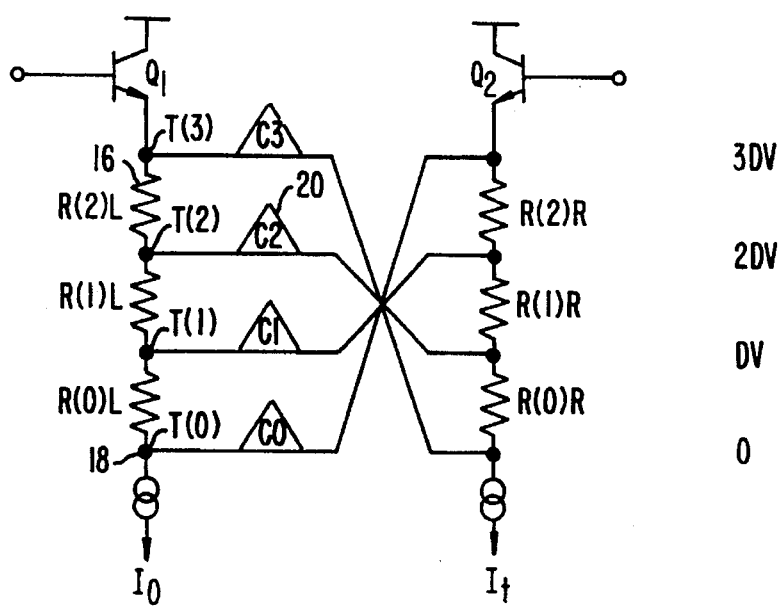
FIG. 2 is a circuit diagram of an embodiment having four comparators.

The general principles of operation of the circuit when a non-zero differential signal is received will now be described with reference to FIG. 2, which depicts a circuit where the having 3 RBIT resistors 16, N=2, and 4 comparators 20 (N+1)=3. As depicted in the FIG. 2, voltage levels at the nodes of the DRL for the zero-signal state are equal nDV. The input signals at the comparators 20 are the differences between the voltage levels at the left and right comparator inputs. In the zero-signal state, the inputs to the comparators, i.e, the difference between the voltage level at the left and right comparator inputs, are:

C0(input)=−3DV

C1(input)=−1DV

C2(input)=1DV

C3(input)=3DV

If the output of the comparator is high (H or logic "1") when the input signal difference is positive and low (L or logic "0") when the input signal difference is negative then for the zero-signal state half the comparators have high outputs and half have low outputs.

The comparator outputs are supplied to an encoder (not shown) which encodes the position of the transition from an H to an L to digitally encode the value of the differential input voltage.

If a signal is received that increases the voltage level at INL by dv and decreases the magnitude of INR by dv then, as is well-known, the voltage levels at the emitters of Q1 and Q2 change by the same amount. However, the current through the legs DRL 14 does not change because of the connection to the current sources 24. Accordingly, the input voltage levels to the comparators are:

C0(input)=−3DV+2dv

C1(input)=−1DV+2dv

C2(input)=1DV+2dv

C3(input)=3DV+2dv

The inputs signal at C1 will become positive when dv=DV/2 and the output of C1 will switch from L to H. For a signal swing of the opposite sense the output of C2 will become negative when dv=−DV/2 so that the LSB sensitivity of the ADC is equal to DV. If dv=DV/2 when C1 has switched then the input level at C0 is:

C0(input)=−3DV+2(DV/2)=−2DV now if dv increases further in magnitude the input at C0 is:

C0(input)=−2DV+2dv so that the input to C0 becomes positive when dv further increases by DV.

Figure 3:
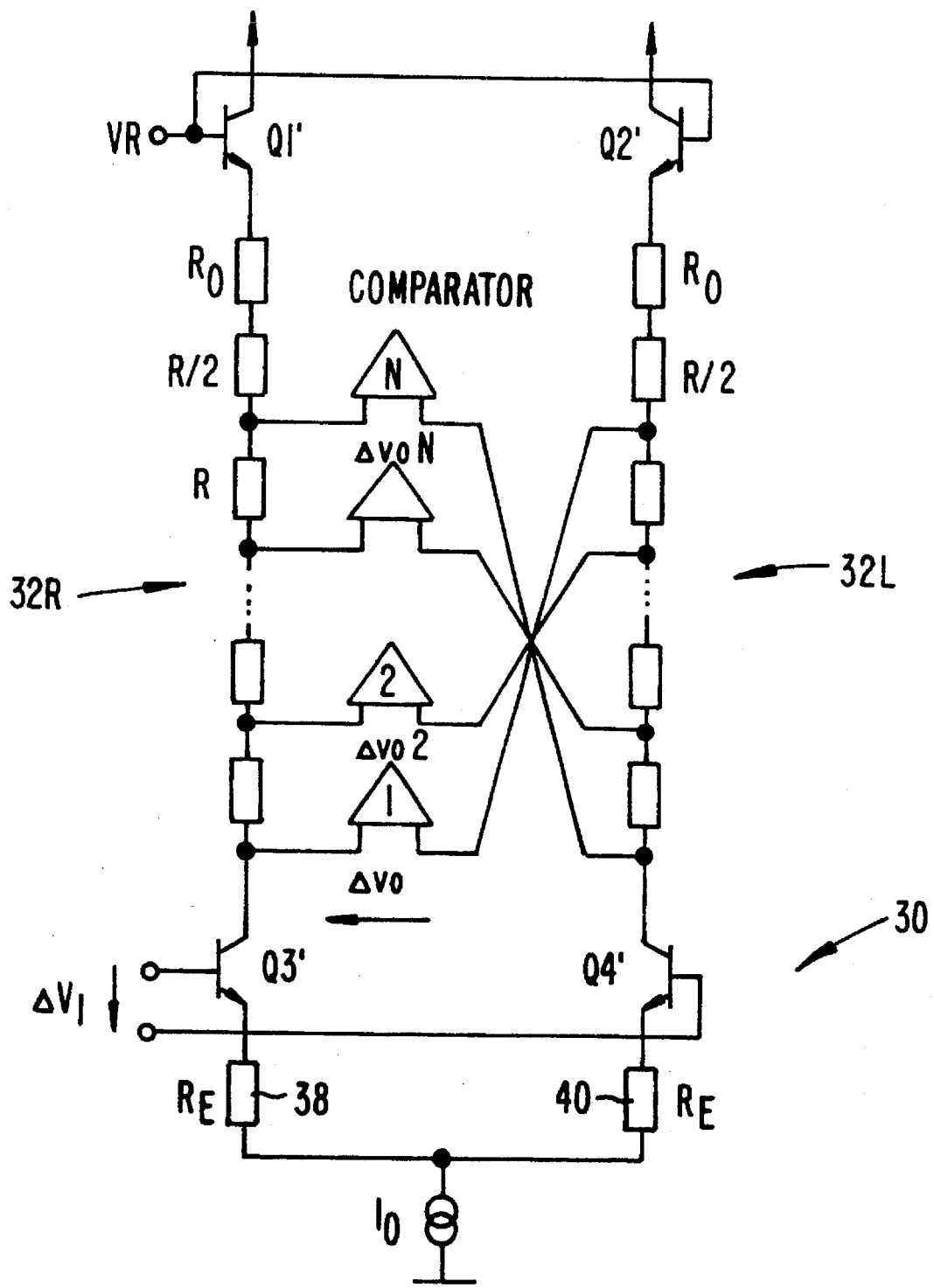
FIG. 3 is a circuit diagram of a prior art system.

The use of a common collector (emitter follower) input stage in the present invention provides several significant advantages over the circuit in FIG. 3. In particular, the elimination of the requirement of an emitter degeneration and additional load resistors shrinks the circuit on an IC and makes resistor matching much easier. Additionally, because each leg of the DRL 14 operates at fixed current the VBE modulation compensation circuit, Q1' and Q2', is not required.

Several other performance advantages also result. The common collector input stage 12 eliminates the effect of Miller capacitance feedback to increase input signal bandwidth. Further, the input signal range is wider and the required power supply level and signal distortion are lower due to the circuit configuration and unity gain implementation.

The invention has now been described with reference to the preferred embodiments. Alternatives and substitutions will now be apparent to persons of ordinary skill in the art. For example, in the preferred embodiment a differential input stage utilizing npn transistors coupled in a common collector (emitter follower) configuration is depicted. However, as is known in the art an MOS, CMOS or GaAs system utilizing a source follower differential input stage would realize the advantages of the invention. Additionally, the resistive elements may be resistors fabricated of polysilicide or metal or may be active devices coupled to create IR voltage drops across their terminals. The resistor elements in the DRL could also have different resistance values to implement a non-linear ADC. Accordingly, it is not intended to limit the invention except as provided by the appended claims.

What is claimed is:

1. An analog to digital convertor comprising:

an input follower differential input stage, having first and second inputs coupled to receive a differential input signal and having first and second outputs for providing a differential output signal;

first and second current sources for providing a constant reference current;

a differential resistive ladder (DRL) having first and second legs with each leg having a series of (N+2) nodes, where N is a predetermined integer, starting with an input node and ending with an output node with the input node of the first and second legs coupled to the first and second outputs, respectively, of the differential input stage and the output nodes of the first and second legs coupled, respectively, to the first and second current sources, said DRL for providing a voltage difference between adjacent nodes determined by the differential output signal and the constant reference current; and a comparator array comprising (N+2) comparators, with the nth comparator, n=0, 1, ..., N, N+1, having a first input coupled to a node of the first leg displaced from the output node of the first leg by n nodes and a second input coupled to a node in the second leg displaced from the input node of the second leg by n nodes.

2. The ADC of claim 1 wherein said differential input stage comprises:

a first bipolar transistor having its collector coupled to a supply voltage, its base coupled to receive a first part of the differential input signal, and its emitter coupled to the first output of the differential input stage; and a second transistor having its collector coupled to a supply voltage, its base coupled to receive a second part of the differential input signal, and its emitter coupled to the second output of the differential input stage.

3. The ADC of claim 2 wherein said first current source comprises:

a third transistor having its collector coupled to the output node of said first leg of the DRL, its base coupled to receive a bias voltage level, and an emitter; and a programming resistor coupling the emitter of said third transistor to ground.

4. The ADC of claim 1 wherein said first leg of said differential resistive ladder comprises:

a plurality of series connected resistors.

* * * * *